United States Patent
Gerstenhaber et al.

(10) Patent No.: US 8,907,725 B2
(45) Date of Patent: Dec. 9, 2014

(54) CIRCUIT TO PREVENT LOAD-INDUCED NON-LINEARITY IN OPERATIONAL AMPLIFIERS

(71) Applicant: Analog Devices, Inc., Norwood, MA (US)

(72) Inventors: Moshe Gerstenhaber, Newton, MA (US); Rayal Johnson, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 107 days.

(21) Appl. No.: 13/625,604

(22) Filed: Sep. 24, 2012

(65) Prior Publication Data

US 2014/0085005 A1   Mar. 27, 2014

(51) Int. Cl.
    *H03F 3/45*   (2006.01)
(52) U.S. Cl.
    CPC .......................................... *H03F 3/45* (2013.01)
    USPC ............................. 330/257; 330/252; 330/288
(58) Field of Classification Search
    CPC .......................................................... H03F 3/45
    USPC ........................................ 330/252, 257, 288
    See application file for complete search history.

(56) References Cited

U.S. PATENT DOCUMENTS

| 5,166,637 A | 11/1992 | Wurcer |
| 5,285,168 A * | 2/1994 | Tomatsu et al. ............... 330/253 |
| 7,545,215 B2 | 6/2009 | Gerstenhaber et al. |
| 7,679,442 B2 | 3/2010 | Gerstenhaber et al. |

OTHER PUBLICATIONS

Analog Devices, *Ultralow Distortion, Ultralow Noise Op Amp.*, AD797 Data Sheet, 20 pages (Jun. 2010).

* cited by examiner

*Primary Examiner* — Robert Pascal
*Assistant Examiner* — Khiem Nguyen
(74) *Attorney, Agent, or Firm* — Knobbe, Martens, Olson & Bear, LLP

(57) ABSTRACT

Apparatus and methods for reducing load-induced non-linearity in amplifiers are provided. In certain implementations, an amplifier includes a current mirror, a buffer circuit, and an output stage. The buffer circuit can have a relatively high current gain and a voltage gain about equal to 1. The buffer circuit can amplify a mirrored current generated by the current mirror and provide the amplified mirrored current to the output stage, thereby helping to balance or equalize currents in the current mirror and avoiding the impact of load-induced offset error.

20 Claims, 3 Drawing Sheets

CIRCUIT TO PREVENT LOAD-INDUCED NON-LINEARITY IN OPERATIONAL AMPLIFIERS

BACKGROUND

1. Field

Embodiments of the invention relate to electronic systems, and more particularly, to amplifiers.

2. Description of the Related Technology

An operational amplifier may be configured as an AC or DC coupled high-gain electronic voltage amplifier with a differential input. In some implementations, the operational amplifier is configured to include a single-ended output that is coupled to a load. The output of the operational amplifier may be linearly related to the differential input of the amplifier due to the high gain of the amplifier and feedback. When the output is coupled to a load, however, load-induced modulation of the output may result in non-linearity between the input voltage and the output voltage.

SUMMARY

In one embodiment, an amplifier includes a current mirror configured to receive a differential input current corresponding to a difference between a first input current and a second input current. The current mirror includes a first current mirror transistor including a collector configured to receive at least a portion of the first input current and a second current mirror transistor including a collector configured to receive at least a portion of the second input current. The second current mirror transistor further includes a base coupled to a base of the first current mirror transistor. The amplifier further includes an output terminal and an output circuit coupled to the output terminal and configured to generate a load current when the output terminal is coupled to a load. The output circuit includes a first output transistor configured to control a magnitude of the load current at least in part. The amplifier further includes a buffer circuit including a first buffer transistor and a second buffer transistor. The first buffer transistor includes a base coupled to the collector of the second current mirror transistor. The second buffer transistor includes a base coupled to a base of the first output transistor and an emitter coupled to an emitter of the first buffer transistor.

In another embodiment, a method of electronic amplification is provided. The method includes generating a mirrored current based on a differential input current using a current mirror, amplifying the mirrored current to generate an amplified current using a buffer circuit, and generating a load current using an output circuit. The differential input current corresponds to a difference between a first input current and a second input current. The current mirror includes a first current mirror transistor including a collector configured to receive at least a portion of the first input current. The current mirror further includes a second current mirror transistor including a collector configured to receive at least a portion of the second input current and a base coupled to a base of the first current mirror transistor. The buffer circuit includes a first buffer transistor and a second buffer transistor. The first buffer transistor includes a base coupled to the collector of the second current mirror transistor and an emitter coupled to an emitter of the second buffer transistor. The second buffer transistor includes a collector and a base configured to output the amplified current. The output circuit includes a first output transistor including a base coupled to the base of the second buffer transistor.

DETAILED DESCRIPTION OF CERTAIN EMBODIMENTS

Figure 1:
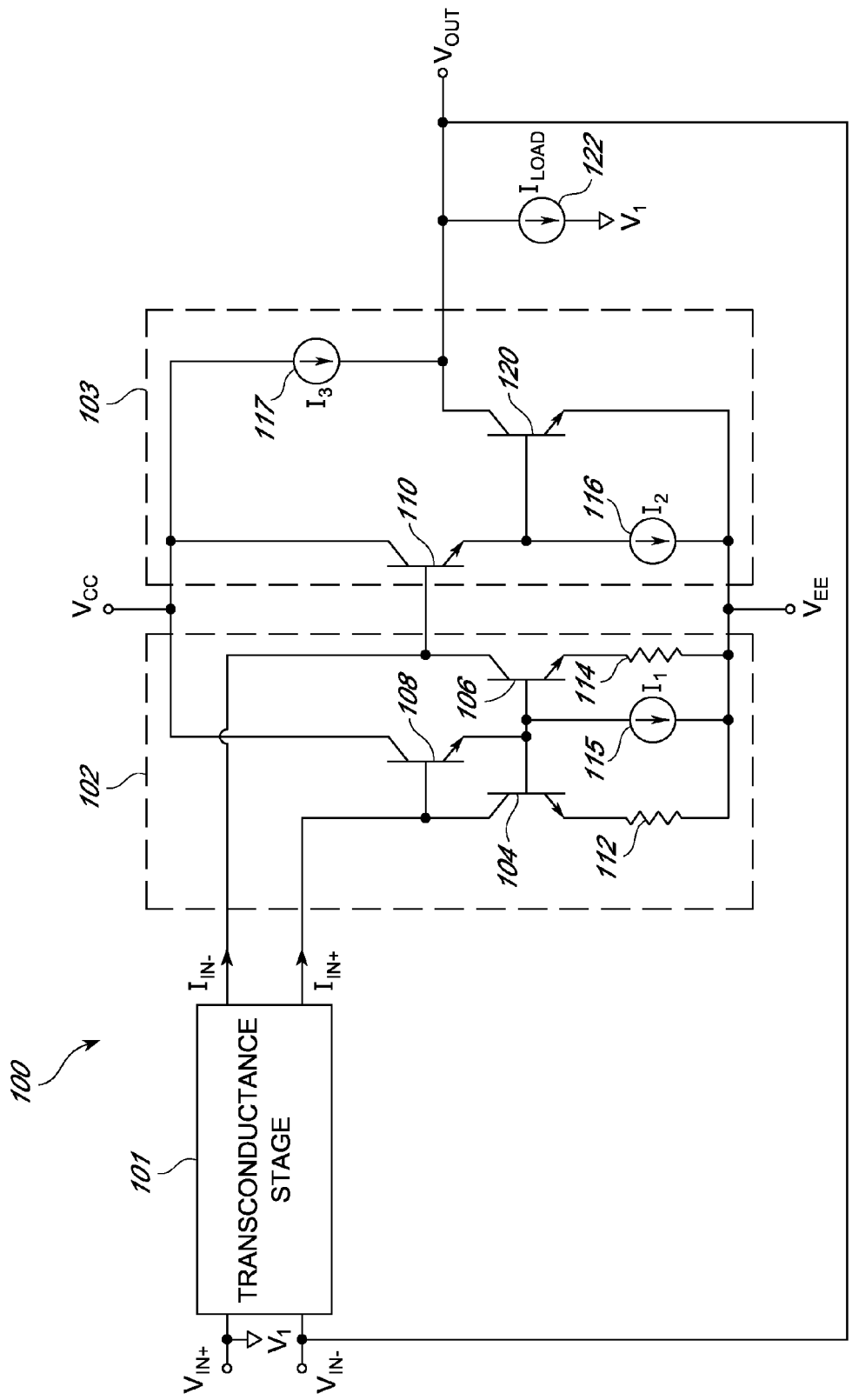
FIG. 1 illustrates one example of an amplifier.

The following detailed description of certain embodiments presents various descriptions of specific embodiments of the invention. However, the invention can be embodied in a multitude of different ways, for example, as defined and covered by the claims. In this description, reference is made to the drawings in which like reference numerals indicate identical or functionally similar elements.

FIG. 1 illustrates one example of an amplifier 100. The amplifier 100 includes a first or non-inverting input voltage terminal $V_{IN+}$, a second or inverting input voltage terminal $V_{IN-}$, and an output voltage terminal $V_{OUT}$. The amplifier 100 further includes a transconductance or input stage 101, a second stage or current mirror 102, and an output stage or circuit 103.

The transconductance stage 101 includes a differential input coupled to the non-inverting and inverting input voltage terminals $V_{IN+}$, $V_{IN-}$, and a differential output configured to generate a differential input current $(I_{IN+}-I_{IN-})$ based on a voltage difference between the non-inverting and inverting input voltage terminals $V_{IN+}$, $V_{IN-}$. The differential input current $(I_{IN+}-I_{IN-})$ can represent a difference between a first or non-inverting input current $I_{IN+}$ and a second or inverting input current and in certain implementations can have a value of about $g_m*(V_{IN+}-V_{IN-})$, where $g_m$ is the transconductance of the transconductance stage 101 and $V_{IN+}$ and $V_{IN-}$ are the voltage levels of the non-inverting and inverting voltage input terminals $V_{IN+}$, $V_{IN-}$, respectively. The current mirror 102 is configured to receive the differential input current $(I_{IN+}-T_{IN-})$ and to generate a mirrored current, which the output stage 103 can use to control the voltage level of the output voltage terminal $V_{OUT}$.

In the illustrated configuration, the amplifier 100 has been electrically connected in a negative feedback configuration in which the amplifier 100 operates as a unity gain voltage buffer. For example, the output voltage terminal $V_{OUT}$ has been electrically connected to the inverting input voltage terminal $V_{IN-}$, and the non-inverting input voltage terminal $V_{IN+}$ has been electrically connected to a first voltage $V_1$, which can be, for example, ground. Additionally, the amplifier 100 has been annotated to include a load current source 122, which has been used to represent a load current $I_{LOAD}$ provided to a load on the output stage 103, including, for example, any current provided by the output stage 103 to the non-inverting input voltage terminal $V_{IN-}$ and/or any other load.

The current mirror 102 can be used to generate a mirrored current for the output stage 103 using the differential input current $(I_{IN+}-T_{IN-})$ received from the transconductance stage 101. As shown in FIG. 1, the current mirror 102 includes a first current mirror transistor 104, a second current mirror transistor 106, a third current mirror transistor 108, a first resistor 112, a second resistor 114, and a first current source 115. The third current mirror transistor 108 includes a base coupled to a collector of the first current mirror transistor 104 at a node of the current mirror 102 configured to receive the non-inverting input current $I_{IN+}$. A collector of the third current mirror transistor 108 is coupled to a power supply terminal $V_{CC}$. An emitter of the third current mirror transistor 108 is coupled to the bases of the first and second current mirror transistors 104, 106 and to a first terminal of the first current source 115. The first current source 115 further includes a second terminal coupled to a power supply terminal $V_{EE}$. An emitter of the first current mirror transistor 104 is coupled to the power supply terminal $V_{EE}$ through the first resistor 112. An emitter of the second current mirror transistor 106 is coupled to the power supply terminal $V_{EE}$ through the second resistor 114. A collector of the second current mirror transistor 106 is coupled to an input of the output stage 103 at a node of the current mirror 102 configured to receive the inverting input current $IN_-$. In certain implementations, the power supply terminal $V_{CC}$ is configured to receive a positive supply voltage (such as +15V), while the power supply terminal $V_{EE}$ is configured to receive a negative voltage (such as −15V).

The output stage 103 can be used to control the voltage level of the output voltage terminal $V_{OUT}$ based on the mirrored current received from the current mirror 102. In the illustrated configuration, the output of the current mirror is a single-ended current about equal to a difference between the non-inverting input current $I_{IN+}$ and the inverting input current $IN_-$. The output stage 103 includes a first output transistor 110, a second output transistor 120, a second current source 116, and a third current source 117. The first output transistor 110 includes a base electrically connected to the collector of the second current mirror transistor 106. A collector of the first output transistor 110 is coupled to the power supply terminal $V_{CC}$, and an emitter of the first output transistor 110 is coupled to a base of the second output transistor 120 and to a first terminal of the second current source 116. An emitter of the second output transistor 120 and a second terminal of the second current source 116 are coupled to the power supply terminal $V_{EE}$. A collector of the second output transistor 120 is coupled to the output voltage terminal $V_{OUT}$ and to a first terminal of the third current source 117. A second terminal of the third current source 117 is coupled to the power supply terminal $V_{CC}$.

As described earlier, the amplifier 100 has been connected in a negative feedback configuration in which the amplifier 100 operates as a unity gain buffer. The negative feedback can result in the non-inverting and inverting input voltage terminals $V_{IN+}$, $V_{IN-}$ having voltage levels that are about equal in the steady-state. Thus, the amplifier 100 can be used to control the voltage level of the output voltage terminal $V_{OUT}$ to be about equal to the voltage level of the first voltage $V_1$.

When the amplifier 100 operates with negative feedback such as in a unity gain buffer configuration, the currents through the first resistor 112 and the second resistor 114 of the current mirror 102 are, in an ideal case, substantially equal. For example, when the voltage levels of the non-inverting and inverting input voltage terminals $V_{IN+}$, $V_{IN-}$ are equal, the differential input current ($I_{IN+} - I_{IN-}$) can be zero, which can correspond to a condition in which the currents through the first and second resistors 112, 114 are substantially equal.

The amplifier 100 can suffer from various sources of offset error associated with connecting the output voltage terminal $V_{OUT}$ to a load. For example, when the amplifier's output voltage terminal $V_{OUT}$ is coupled to the amplifier's inverting input voltage terminal $V_{IN-}$, the output stage 103 can supply the load current $I_{LOAD}$. Unless the load current $I_{LOAD}$ is about zero, the collector current of the second output transistor 120 can increase or decrease depending on the relative sizes of the third current $I_3$ and the load current $I_{LOAD}$. The load-induced collector current of the second output transistor 120 can be associated with a corresponding base current of the first output transistor 110, which can generate mismatch between the non-inverting input current $I_{IN+}$ and the inverting input current $I_{IN-}$.

The flow of current into the base of the first output transistor 110 can also increase the collector voltage of the second current mirror transistor 106 relative to the collector voltage of the first current mirror transistor 104, which can cause further mismatch between the non-inverting input current $I_{IN+}$ and the inverting input current $I_{IN-}$ due to the Early effect. Since mismatch between the non-inverting input current $I_{IN+}$ and the inverting input current can correspond to an offset error, the amplifier 100 can have a load-induced offset error or non-linearity associated with connecting the amplifier 100 to a load. The load-induced offset error can be present when the amplifier 100 is connected in other ways other than a unity gain buffer configuration, including, for example, implementations in which feedback is provided using a voltage divider.

Mismatch between the first and second resistors 112, 114 can also increase offset error and degrade the amplifier's linearity. For example, a difference in the resistances of the first and second resistors 112, 114 can correspond to a difference between the base-collector voltages of the first and second current mirror transistors 104, 106. The difference in base-collector voltages between the first and second current mirror transistors 104, 106 can generate a mismatch between the non-inverting input current $I_{IN+}$ and the inverting input current due to the Early effect. Accordingly, mismatch between the first and second resistors 112, 114 can cause a difference between the non-inverting input current $I_{IN+}$ and the inverting input current $I_{IN-}$ and a corresponding offset error.

In certain implementations, amplifiers including a current mirror, a buffer circuit, and an output stage are provided. The buffer circuit can have a relatively high current gain and a voltage gain about equal to 1. The buffer circuit can amplify a mirrored current generated by the current mirror and provide the amplified current to the output stage, thereby helping to balance or equalize currents in the current mirror and reducing load-induced offset error. For example, the buffer circuit can be used to reduce the impact of a change in the base current of an output transistor used to drive the amplifier's load by a current gain of the buffer circuit. Additionally, in certain implementations the buffer circuit includes a voltage compensation component that can be used to control the base-collector voltages of certain transistors used in the current mirror to be about equal, thereby reducing or eliminating initial error associated with the Early effect.

Figure 2:
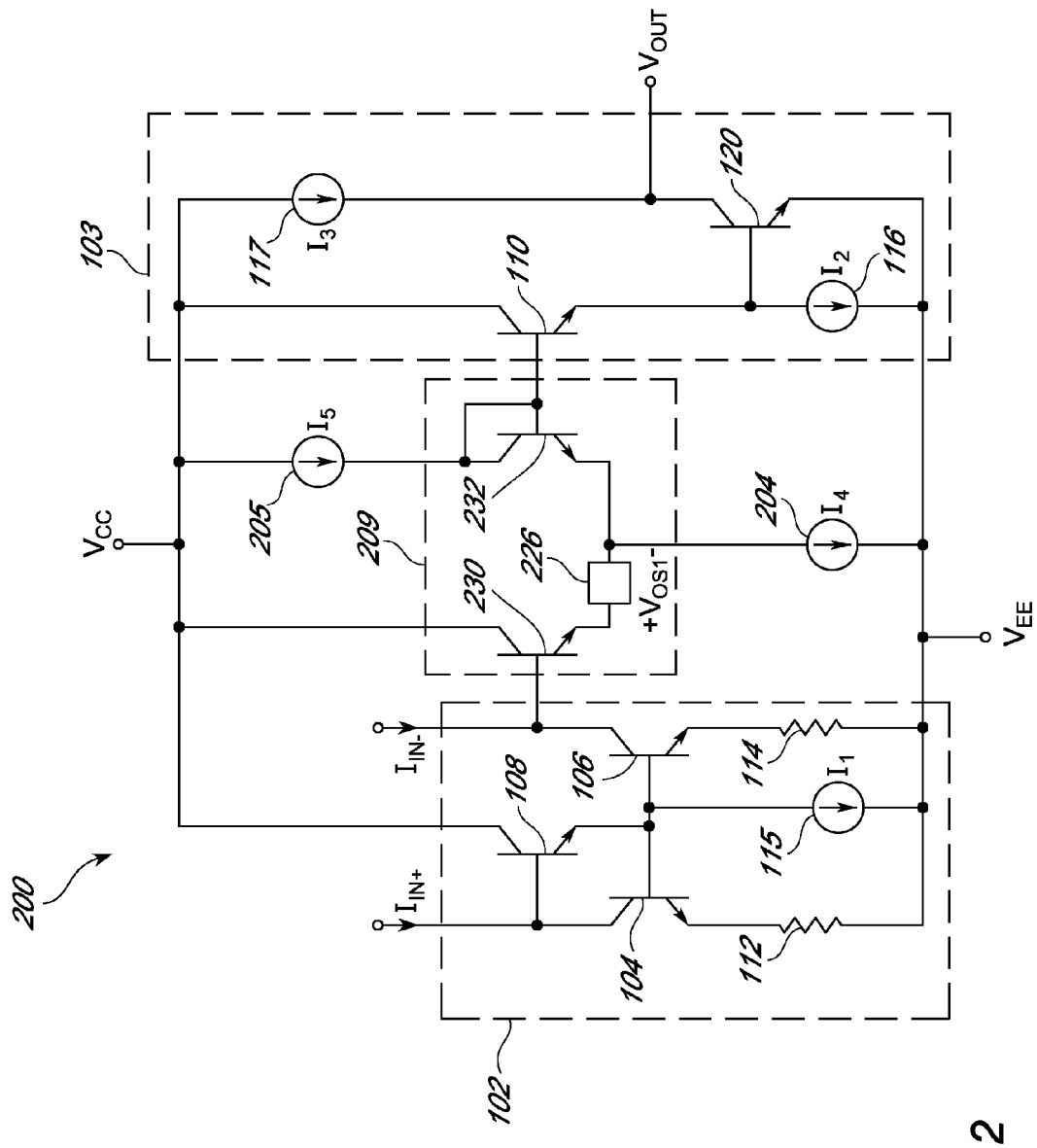
FIG. 2 illustrates one embodiment of an amplification circuit including a buffer circuit.

FIG. 2 illustrates one embodiment of an amplification circuit 200 including a buffer circuit 209. The amplification circuit 200 includes the current mirror 102 and the output stage 103, which can be as described earlier with reference to FIG. 1. The amplification circuit 200 further includes the buffer circuit 209, a fourth current source 204, and a fifth current source 205. The amplification circuit 200 can be used in an amplifier, such as the amplifier 100 of FIG. 1. For example, the differential input current ($I_{IN+} - I_{IN-}$) can be provided to the amplification circuit 200 using a transconductance stage.

As shown in FIG. 2, the buffer circuit 209 operates as a buffer between the current mirror 102 and the output stage 103. For example, the buffer circuit 209 has been configured to receive the mirrored current generated by the current mirror 102 and to provide an amplified mirrored current to the output stage 103. In the illustrated configuration the buffer circuit 209 includes a current input coupled to a collector of the second current mirror transistor 106 and a current output coupled to a base of the first output transistor 110.

The illustrated buffer circuit 209 includes a first buffer transistor 230, a second buffer transistor 232, and a voltage compensation component 226. A base of the first buffer transistor 230 is coupled to the collector of second current mirror transistor 106 and a base of the second buffer transistor 232 is coupled to the base of the first output transistor 110. Additionally, a collector of the first buffer transistor 230 is coupled to the power supply terminal $V_{CC}$, and an emitter of the first buffer transistor 230 is coupled to an emitter of the second buffer transistor 232 through the voltage compensation component 226. For example, the voltage compensation component 226 includes a first terminal coupled to the emitter of the first buffer transistor 230 and a second terminal coupled to the emitter of the second buffer transistor 232. Furthermore, the emitter of the second buffer transistor 232 is coupled to a first terminal of the fourth current source 204. The fourth current source 204 further includes a second terminal coupled to the power supply terminal $V_{EE}$. Additionally, a collector of the second buffer transistor 232 is coupled to the base of the second buffer transistor 232 and to a first terminal of the fifth current source 205. The fifth current source 205 further includes a second terminal coupled to the power supply terminal $V_{CC}$.

The voltage compensation component 226 can be used to control the collector voltage of the second current mirror transistor 106 relative to the collector voltage of the first current mirror transistor 104. Thus, the voltage compensation component 226 can be used to reduce a difference between the collector-base voltages of the first and second current mirror transistors 104, 106, thereby helping to balance the magnitudes of the non-inverting and inverting input currents $I_{IN+}$, when the amplification circuit 200 is used closed-loop. For example, increasing a first offset voltage $V_{OS1}$ across the voltage compensation component 226 can be used to increase the collector voltage of the second current mirror transistor 106 relative to the collector voltage of the first current mirror transistor 104. Accordingly, the voltage of the first offset voltage $V_{OS1}$ can be selected so as to balance or equalize the base-collector voltages of the first and second current mirror transistors 104, 106.

In some implementations, the voltage compensation component 226 includes a resistor configured to provide a voltage drop of a desired value. Since a current through the voltage compensation circuit 226 can be equal to the difference of a fourth current $I_4$ of the fourth current source 204 and a fifth current $I_5$ of the fifth current source 205, the resistance of the voltage compensation circuit 226 can be selected to achieve a desired voltage drop. For example, when the fourth current $I_4$ is about 20 μA and the fifth current $I_5$ is about 10 μA and a collector voltage of the first current mirror transistor 104 is about 50 mV greater than a collector voltage of the second current mirror transistor 106 absent voltage compensation, the voltage compensation component 226 can be configured to have a resistance of about 5 kΩ so as to provide about 50 mV of voltage compensation. Although one example of voltage compensation has been described, other values will be readily determined by persons having ordinary skill in the art.

The buffer circuit 209 shown in FIG. 2 can have a relatively large current gain while maintaining a voltage gain of about 1. For example, in some implementations the buffer circuit 209 can have a current gain about equal to a common-emitter current gain or beta ("β") of the first and second buffer transistors 230, 232, which can have a value of, for example, about 100 or more. Since the impact of a load current associated with the output voltage terminal $V_{OUT}$ can be a function of the current gain of the amplification circuit 200, increasing the current gain of the amplification circuit 200 can reduce the amplification circuit's load-induced offset voltage. For example, a change in the inverting input current $T_{IN-}$ associated with a load current can be reduced by a factor of about $G_B$ relative to a configuration in which the buffer circuit 209 is omitted, where $G_B$ is the current gain of the buffer circuit 209. In one embodiment, the first and second buffer transistors 230, 232 are super-beta bipolar transistors have a beta of about 1,000 or more.

The buffer circuit 209 can be used to buffer or isolate the current mirror 102 from changes in a load current generated by the output stage 103. By coupling the buffer circuit 209 between a current mirror and one or more output transistors of the amplifier, load induced non-linearity caused by load current can be substantially reduced or eliminated. The buffer circuit 209 also serves to match the bias conditions of transistors in the current mirror 102 (for example, the first current mirror transistor 104 and the second current mirror transistor 106), thereby reducing offset associated with collector-base mismatches and Early voltage effects. The buffer circuit 209 can also reduce offset drift at relatively high temperatures by ensuring that all the transistors that may contribute to offset error have matched bias conditions with changing temperature.

The buffer circuit 209 can provide enhanced performance and/or reduced overhead relative to schemes employing other amplification circuitry between the current mirror 102 and the output stage 103. For example, including a high voltage gain amplification stage between the current mirror 102 and the output stage 103 can add complexity in frequency compensation when the resulting amplification circuit is used closed-loop. Additionally, using emitter-follower level shifters between the current mirror 102 and the output stage 103 can increase a minimum power supply necessary and/or complexity of the amplification circuit. In contrast, a buffer circuit can be configured to have a DC input voltage that is about equal to a DC output voltage.

Although a buffer circuit has been illustrated in the context of an amplification circuit that includes the current mirror 102 and the output stage 103, buffer circuits can be used in other configurations of amplification circuits. For example, alternative implementations of the current mirror 102 can be used, including, for example, a current mirror including a different arrangement of components and/or more or fewer components. Furthermore, although one implementation of the output stage 103 has been illustrated, a buffer circuit can be used in combination with other output stages, including, for instance, output stages using more or fewer output transistors. For example, in certain implementations, the first and second output transistors 110, 120 need not be connected in a Darlington configuration, but rather can be configured to provide amplification in other ways.

Figure 3:
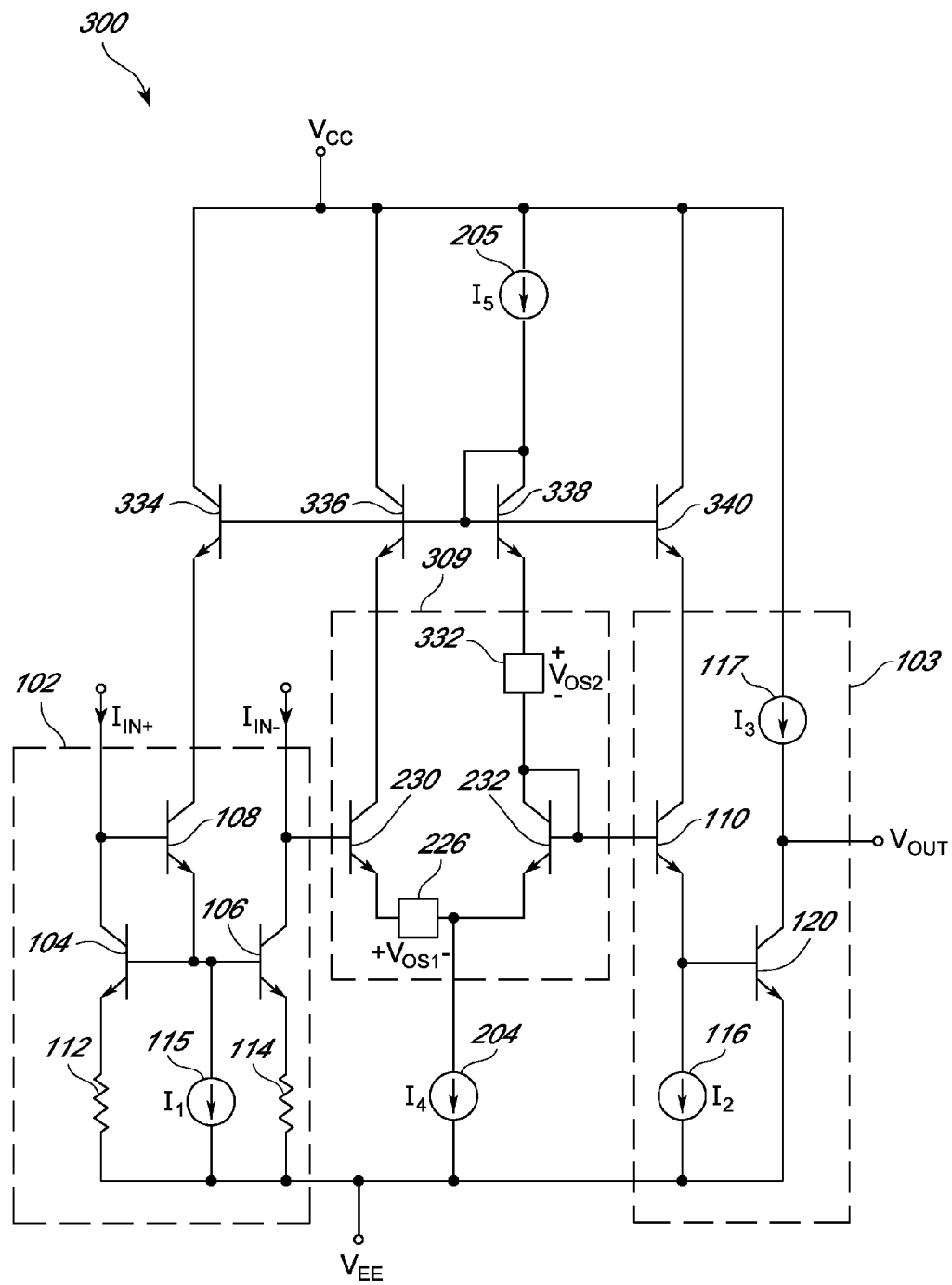
FIG. 3 illustrates another embodiment of an amplification circuit including a buffer circuit.

FIG. 3 illustrates another embodiment of an amplification circuit 300 including a buffer circuit 309.

The amplification circuit 300 of FIG. 3 is similar to the amplification circuit 200 of FIG. 2, except that the amplification circuit 300 further includes a first cascode transistor 334, a second cascode transistor 336, a third cascode transistor 340, and a diode-connected transistor 338. Additionally, the amplification circuit 300 of FIG. 3 includes a different arrangement of a buffer circuit relative to the configuration shown in FIG. 2. For example, the buffer circuit 309 of FIG. 3 includes the first buffer transistor 230, the second buffer transistor 232, the first voltage compensation component 226, and a second voltage compensation component 332.

The first cascode transistor 334 includes a collector coupled to the power supply terminal $V_{CC}$ and an emitter coupled to a collector of the third current mirror transistor 108. The second cascode transistor 336 includes a collector coupled to the power supply terminal $V_{CC}$ and an emitter coupled to the collector of the first buffer transistor 230. The third cascode transistor 340 includes a collector coupled to the power supply terminal $V_{CC}$ and an emitter coupled to the collector of the first output transistor 110. The diode-connected transistor 338 includes a collector and a base coupled to the first terminal of the fifth current source 205, to a base of the first cascode transistor 334, to a base of the second cascode transistor 336, and to a base of the third cascode transistor 340. The diode-connected transistor 338 further includes an emitter coupled to the collector and base of the second buffer transistor 232 through the second voltage compensation component 332.

The diode-connected transistor 338 can be used to control a cascode base bias voltage of the first to third cascode transistors 334, 336, 340. For example, the diode-connected transistor 338 can operate to increase the base voltage of the first to third cascode transistors 334, 336, 340 when the base voltage of the second output transistor 232 increases and to decrease the base voltage of the first to third cascode transistors 334, 336, 340 when the base voltage of the second output transistor 232 decreases.

The first to third cascode transistors 334, 336, 340 can aid in protecting transistors of the amplification circuit 300 from overvoltage conditions. For example, in an implementation using super-beta transistors, which can have a relatively low collector-emitter breakdown voltage associated with a thin base region, the first to third cascode transistors 334, 336, 340 can be used to protect the super-beta transistors from breakdown voltage conditions.

The first and second cascode transistors 334, 336 can also aid in controlling the collector-base voltages of the amplification circuit so as to reduce the impacts of Early voltage on current mismatch. For example, the first and second cascode transistors 334, 336 can aid in matching the collector-base voltages of the third current mirror transistor 108, and the first buffer transistor 230 over varying operating conditions, including temperature.

The second voltage compensation component 332 is coupled between the emitter of the diode-connected transistor 338 and the collector of the diode-connected second buffer transistor 232. The second voltage compensation component 332 can be used to compensate for a voltage offset resulting from the first voltage compensation component 226 so as to prevent the first buffer transistor 230 from operating in a saturation region of operation. For example, increasing a second offset voltage $V_{OS2}$ across the second voltage compensation component 332 can be used to increase the collector voltage of the first buffer transistor 230 so that the collector-base voltage of the first buffer transistor 230 is forward-biased. Additionally, since the cascode base bias voltage generated by the diode-connected transistor 338 also changes with the second offset voltage $V_{OS2}$, the second voltage compensation component 332 can also be used to prevent the third current mirror transistor 108 from operating in a saturation region of operation. Thus, the second voltage compensation component 332 can be used to control the collector-base voltages of the first buffer transistor 230 and the third current mirror transistor 108.

While FIGS. 1-3 have been illustrated in the context of NPN bipolar transistors, it will be understood that any combination of features described with reference to NPN bipolar transistors can alternatively or additionally be implemented in connection with PNP bipolar transistors. In addition, as used herein, a current source can refer to either a current source or a current sink.

The methods, systems, and/or apparatus described above can be implemented into various electronic devices. Examples of the electronic devices can include, but are not limited to, consumer electronic products, parts of the consumer electronic products, electronic test equipment, etc. Examples of parts of consumer electronic products can include amplifiers, rectifiers, programmable filters, attenuators, variable frequency circuits, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected," as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An amplifier comprising:
a current mirror configured to receive a differential input current corresponding to a difference between a first input current and a second input current, wherein the current mirror comprises a first current mirror transistor comprising a collector configured to receive at least a portion of the first input current, and wherein the current mirror further comprises a second current mirror transistor comprising a collector configured to receive at least a portion of the second input current and a base coupled to a base of the first current mirror transistor;
an output terminal;
an output circuit coupled to the output terminal and configured to generate a load current when the output terminal is coupled to a load, wherein the output circuit includes a first output transistor configured to control a magnitude of the load current at least in part; and
a buffer circuit comprising:
a first buffer transistor comprising a base coupled to the collector of the second current mirror transistor; and
a second buffer transistor comprising a base coupled to a base of the first output transistor and an emitter coupled to an emitter of the first buffer transistor, wherein the second buffer transistor further comprises a collector coupled to the base of the first output transistor and to the base of the second buffer transistor.

2. The amplifier of claim 1, wherein the buffer circuit is configured to isolate the current mirror from changes in the load current.

3. The amplifier of claim 1, wherein the buffer circuit is configured to have a voltage gain of about 1 and a current gain of about 100 or more.

4. The amplifier of claim 3, wherein the first and second buffer transistors are super-beta bipolar transistors having a common-emitter current gain of about 1,000 or more.

5. The amplifier of claim 1, further comprising a first buffer current source and a second buffer current source, wherein the first buffer current source is coupled to an emitter of the second buffer transistor, and wherein the second buffer current source is coupled to the base and the collector of the second buffer transistor.

6. The amplifier of claim 1, further comprising:
a first input terminal;
a second input terminal; and
a transconductance stage coupled to the first and second input terminals, wherein the transconductance stage is configured to amplify a voltage difference between the first and second input terminals to generate the differential input current.

7. The amplifier of claim 1, wherein the first and second current mirror transistors, the first and second buffer transistors, and the first output transistor are NPN bipolar transistors.

8. An amplifier comprising:
a current mirror configured to receive a differential input current corresponding to a difference between a first input current and a second input current, wherein the current mirror comprises a first current mirror transistor comprising a collector configured to receive at least a portion of the first input current, and wherein the current mirror further comprises a second current mirror transistor comprising a collector configured to receive at least a portion of the second input current and a base coupled to a base of the first current mirror transistor;
an output terminal;
an output circuit coupled to the output terminal and configured to generate a load current when the output terminal is coupled to a load, wherein the output circuit includes a first output transistor configured to control a magnitude of the load current at least in part; and
a buffer circuit comprising:
a first buffer transistor comprising a base coupled to the collector of the second current mirror transistor; and
a second buffer transistor comprising a base coupled to a base of the first output transistor and an emitter coupled to an emitter of the first buffer transistor,
wherein the buffer circuit further comprises a first voltage compensation component disposed between the emitter of the first buffer transistor and the emitter of the second buffer transistor, wherein the first voltage compensation component is configured to control a collector-base voltage of the second current mirror transistor relative to a collector-base voltage of the first current mirror transistor.

9. The amplifier of claim 8, wherein the buffer circuit further comprises a second voltage compensation component coupled to a collector of the second buffer transistor, wherein the second voltage compensation component is configured to control a collector-base voltage of the first buffer transistor so as to prevent the first buffer transistor from operating in a saturation region of operation.

10. An amplifier comprising:
a current mirror configured to receive a differential input current corresponding to a difference between a first input current and a second input current, wherein the current mirror comprises a first current mirror transistor comprising a collector configured to receive at least a portion of the first input current, and wherein the current mirror further comprises a second current mirror transistor comprising a collector configured to receive at least a portion of the second input current and a base coupled to a base of the first current mirror transistor;
an output terminal;
an output circuit coupled to the output terminal and configured to generate a load current when the output terminal is coupled to a load, wherein the output circuit includes a first output transistor configured to control a magnitude of the load current at least in part; and
a buffer circuit comprising:
a first buffer transistor comprising a base coupled to the collector of the second current mirror transistor; and
a second buffer transistor comprising a base coupled to a base of the first output transistor and an emitter coupled to an emitter of the first buffer transistor,
wherein the output circuit further comprises a second output transistor, wherein the second output transistor comprises a base coupled to an emitter of the first output transistor and a collector coupled to the output terminal.

11. The amplifier of claim 10, wherein the output circuit further comprises a first output current source and a second output current source, wherein the first output current source is coupled to the emitter of the first output transistor and to the base of the second output transistor, and wherein the second output current source is coupled to the collector of the second output transistor.

12. The amplifier of claim 10, wherein the second buffer transistor further comprises a collector coupled to the base of the first output transistor and to the base of the second buffer transistor.

13. An amplifier comprising:
a current mirror configured to receive a differential input current corresponding to a difference between a first input current and a second input current, wherein the current mirror comprises a first current mirror transistor comprising a collector configured to receive at least a portion of the first input current, and wherein the current mirror further comprises a second current mirror transistor comprising a collector configured to receive at least a portion of the second input current and a base coupled to a base of the first current mirror transistor;
an output terminal;
an output circuit coupled to the output terminal and configured to generate a load current when the output terminal is coupled to a load, wherein the output circuit includes a first output transistor configured to control a magnitude of the load current at least in part; and
a buffer circuit comprising:
a first buffer transistor comprising a base coupled to the collector of the second current mirror transistor; and
a second buffer transistor comprising a base coupled to a base of the first output transistor and an emitter coupled to an emitter of the first buffer transistor,
wherein the current mirror further comprises a third current mirror transistor, wherein the third current mirror transistor comprises a base coupled to the collector of the first current mirror transistor and an emitter coupled to the bases of the first and second current mirror transistors.

14. The amplifier of claim 13, wherein the current mirror further comprises a first resistor, a second resistor, and a current source, and wherein the first resistor is coupled to an emitter of the first current mirror transistor, and wherein the second resistor is coupled to an emitter of the second current mirror transistor, and wherein the current source is coupled to the bases of the first and second current mirror transistors.

15. The amplifier of claim 13, further comprising a first cascode transistor, a second cascode transistor, and a third cascode transistor, wherein the first cascode transistor comprises an emitter coupled to a collector of the third current mirror transistor, and wherein the second cascode transistor comprises an emitter coupled to a collector of the first buffer transistor, and wherein the third cascode transistor comprises an emitter coupled to a collector of the first output transistor.

16. The amplifier of claim 13, wherein the second buffer transistor further comprises a collector coupled to the base of the first output transistor and to the base of the second buffer transistor.

17. The amplifier of claim 16, further comprising:
a first current source coupled to the bases of the first and second current mirror transistors;
a second current source coupled to the emitters of the first and second buffer transistors; and
a third current source coupled to the collector of the second buffer transistor.

18. A method of electronic amplification comprising:
generating a mirrored current based on a differential input current using a current mirror, wherein the differential input current corresponds to a difference between a first input current and a second input current, and wherein the current mirror comprises a first current mirror transistor comprising a collector configured to receive at least a portion of the first input current, and wherein the current mirror further comprises a second current mirror transistor comprising a collector configured to receive at least a portion of the second input current and a base coupled to a base of the first current mirror transistor;
amplifying the mirrored current to generate an amplified current using a buffer circuit, wherein the buffer circuit comprises a first buffer transistor and a second buffer transistor, wherein the first buffer transistor comprises a base coupled to the collector of the second current mirror transistor and an emitter coupled to an emitter of the second buffer transistor, and wherein the second buffer transistor comprises a collector and a base configured to output the amplified current;
generating a load current using an output circuit, wherein the output circuit comprises a first output transistor comprising a base coupled to the base of the second buffer transistor; and
controlling a collector-base voltage of the second current mirror transistor relative to a collector-base voltage of the first current mirror transistor using a first voltage compensation component, wherein the first voltage compensation component is disposed between the emitter of the first buffer transistor and the emitter of the second buffer transistor.

19. The method of claim 18, further comprising controlling a collector-base voltage of the first buffer transistor relative to a collector-base voltage of the third current mirror transistor using a second voltage compensation component, wherein the second voltage compensation component is coupled to a collector of the second buffer transistor.

20. The method of claim 18, wherein the buffer circuit is configured to have a voltage gain of about 1 and a current gain of about 100 or more.

* * * * *